(12) United States Patent
Le Roy et al.

(10) Patent No.: US 6,855,622 B2
(45) Date of Patent: Feb. 15, 2005

(54) METHOD AND APPARATUS FOR FORMING A CAVITY IN A SEMICONDUCTOR SUBSTRATE USING A CHARGED PARTICLE BEAM

(75) Inventors: Erwan Le Roy, San Jose, CA (US); Mark A. Thompson, Austin, TX (US)

(73) Assignee: NPTest, LLC, San Jose, CA (US)

(*) Notice: Subject to any disclaimer, the term of this patent is extended or adjusted under 35 U.S.C. 154(b) by 208 days.

(21) Appl. No.: 10/160,606

(22) Filed: May 30, 2002

(65) Prior Publication Data

US 2003/0224601 A1 Dec. 4, 2003

(51) Int. Cl.⁷ .......................................... H01L 21/425
(52) U.S. Cl. .................. 438/513; 438/514; 438/515; 438/519; 438/524
(58) Field of Search .................. 438/700, 513–515, 438/519, 524

(56) References Cited

U.S. PATENT DOCUMENTS

| | | | |
|---|---|---|---|
| 5,140,164 A | 8/1992 | Talbot et al. | 250/492.2 |
| 5,840,630 A | 11/1998 | Ceccere et al. | 438/712 |
| 6,031,229 A | 2/2000 | Keckley et al. | 250/309 |
| 6,042,738 A * | 3/2000 | Casey et al. | 216/66 |
| 6,225,626 B1 | 5/2001 | Talbot et al. | 250/307 |
| 6,362,475 B1 * | 3/2002 | Bindell et al. | 250/307 |
| 6,483,326 B1 * | 11/2002 | Bruce et al. | 324/751 |

* cited by examiner

*Primary Examiner*—Thanh Nguyen
(74) *Attorney, Agent, or Firm*—Deborah Wenocur

(57) ABSTRACT

Apparatus and method for exposing a selected feature of an integrated circuit device such as a selected portion of the metallization layer, from the backside of the integrated circuit substrate without disturbing adjacent features of the device such as the active semiconductor regions. This is performed using an FIB (focused ion beam) etching process in conjunction with observation by an optical microscope to form a trench through the substrate. The floor of the trench is formed so as to be as smooth and planar as possible, thereby preventing undesirable exposure of the underlying active regions through any unknown or undesired cavity caused by scratches or pits or a deeper than desired sidewall. The smoothness and planarity of the floor of the trench is established by, prior to forming the trench, removing any surface defect initially present by using an FIB etching without use of assist gas to eliminate most scratches or impurities on the surface of the silicon, followed by removal of implanted ions using a gas-injected assisted FIB etch. Then the actual trench is formed using an assisted etch using a more aggressive injected gas.

18 Claims, 5 Drawing Sheets

METHOD AND APPARATUS FOR FORMING A CAVITY IN A SEMICONDUCTOR SUBSTRATE USING A CHARGED PARTICLE BEAM

FIELD OF THE INVENTION

This disclosure pertains to semiconductor technology and more specifically to forming a trench through a semiconductor substrate so as to access, from the backside of the substrate, interconnection metal layers formed on the opposing principal surface of the substrate, the trenching process using a focused ion beam.

DESCRIPTION OF THE PRIOR ART

It is well known to use a focused ion beam (FIB) for exposing conductors on an integrated circuit (IC) to aid in debug, or failure analysis, and repair of the integrated circuit. See for instance U.S. Pat. No. 6,225,626, issued May 1, 2001, to Talbot et al.; U.S. Pat. No. 5,140,164, issued Aug. 18, 1992 to Talbot et al.; and U.S. Pat. No. 5,616,921, issued Apr. 1, 1997 to Talbot et al., all incorporated herein by reference in their entireties. U.S. Pat. No. 6,225,626 discloses methods for exposing a selected feature of an IC such as a selective conductor, from the backside of the IC substrate without disturbing adjacent features of the device, such as the active (semiconductor) regions. The method includes determining a region of the IC in which the selected feature is located; obtaining from the backside of the IC substrate an IR (infra-red) optical microscope image of the region; aligning the IR optical microscope image with a coordinate system of a milling (FIB) system; and using structures visible in the IR microscope image as a guide, operating the milling system to expose the selected feature from the backside of the IC without disturbing adjacent features.

Other aspects of this approach include forming the trench through the backside of the substrate where the trench is stepped in cross-section and milling down all the way through the substrate from the backside surface thereof to the principal surface thereof, to expose the metal interconnections typically formed overlying the principal surface of the substrate. The focused ion beam is then used to cut or reform various of these portions of these metal layers in order to reconnect the transistors formed within the substrate. This is used typically for failure analysis, debug, and repair (rework) of ICs. It is most typically used in the research and development and manufacturing engineering stages, but is applicable to reworking of actual production ICs. Schlumberger Technologies Inc., assignee of this application and of the above-referenced patents, produces commercially available FIB systems, such as the IDS P2X and IDS P3X systems and the IDS OptiFIB system. This IDS OptiFIB system includes the focused ion beam column coaxial with a light optical microscope for simultaneous optical observation of the milling process.

It has been recognized by the present inventors that prior to performing circuit editing (cutting and/or filling in of the metal layers), the trench itself, which is formed through the backside surface of the substrate, must be etched precisely. In certain applications the trench does not extend all the way through the substrate; instead, it extends to within, for instance, 2 to 5 $\mu$m to the principal surface of the substrate, leaving an intervening thin layer of, e.g., silicon. In this case, the actual circuit editing is performed by the FIB. This ion beam is capable of milling through the last few microns of silicon and into the dielectric and thereby performing a circuit (metal layer) edit. It has been determined also by the present inventors that in order for this thin remaining layer of silicon to be optimal for circuit edit, its thickness must be uniform. Since this silicon layer is the floor of the trench formed from the backside surface of the substrate, the present inventors have determined that it is preferred that the floor of the trench be nearly perfectly flat and/or exactly parallel in terms of its planarity with the principal surface of the substrate.

Otherwise, if the trench floor is not perfectly flat (smooth) and contains, for instance, cavities such as scratches and pits, those scratches and pits will allow excess energy of the ion beam to penetrate therethrough and damage active regions (transistors) so as to not perform an accurate circuit edit. Such scratches and pits may be aggravated due to the fast silicon removal rate of the assist chemistry, which is typically injected into the FIB milling. Similar problems arise if the trench floor is overetched on one side.

FIB systems typically include a source of ions, such as gallium ions, suitable magnetic and/or electric lenses for focusing the ion beam, and also a source of an injected assist material (e.g., gas), such as xenon difluoride ($XeF_2$). The injected gas typically etches away the substrate material (e.g., silicon) relatively quickly and any surface defect initially present on the original obverse (backside) surface of the substrate prior to the trench formation becomes a susceptible site where the injected gas is locally confined and locally overetches the trench. This causes the pits or scratches to extend all the way through the trench formation process and which are thereby replicated on the floor of the trench near the principal surface of the substrate at the end of the trench formation.

It is believed that others in the field have not recognized the significance of having such a flat and perpendicular trench floor. This has been found by the present inventors to be a significant shortcoming of FIB trench etching processes which to the extent they have achieved a flat trench floor have done so by various specialized processes, such as milling, lapping, or reactive ion etching (RIE). These processes are applied to the original backside surface of the substrate prior to the trench etching itself. They are routinely used as part of a thinning process of the substrate. For flip chip substrates, the die thinning from the backside is typically done using a lapping tool. One then checks the remaining silicon thickness with a reflectometer. For all types of packages where the substrate (die) is inside a cavity in the package, one must use a local mechanical tip to thin the die. Typically the substrate being examined is reduced to a thickness of 100 $\mu$m or less. These mechanical die thinning techniques are used because large scale bulk silicon removal would take too long using the ion beam. Also, it has been found that the optical image quality improves when the silicon thickness is reduced. These thinning processes are relatively cumbersome and also have been found to still leave significant surface defects in the backside die surface. Hence, even with the prior art cumbersome milling or lapping process, the surface defects are still present which end up undesirably replicating themselves in the bottom of the trench, i.e., the trench floor.

SUMMARY

As disclosed here, the trench formation process is modified in terms of the pretreatment of the original substrate surface in which the trench is to be formed. This modification involves a local surface cleaning process to remove the substrate preparation imperfections, such as scratches or impurities, prior to the trenching process itself. It is to be noted that certain of these imperfections may in fact be the result of the prepatory substrate lapping, milling or RIE processes. While in accordance with the present method there is still some preparatory milling or lapping or reactive ion etching, this need not be as carefully done as in the prior art, since it is not the final process of the trench surface preparation, but is instead followed by the additional step of substrate local surface cleaning. This additional step includes focused ion beam milling using in one embodiment a less aggressive injected gas (such as EDI—ethylene-di-iodide) than is used with the main trench etching FIB process.

Hence, as disclosed here, first any anti-reflective coating present on the substrate surface in which the trench is to-be formed is locally removed. Then an "unassisted etch" process (this is an FIB milling process with no injected gas) is used to smooth the entire exposed substrate surface. If the scratches or pits are deep, the FIB is defocused. During that time, typically, as a result a Ga+ (gallium ion) implanted layer is formed from the FIB Ga+ ions at the exposed surface. Next, this implanted layer is removed using the FIB with an injected gas but not using the same gas as used later to etch the trench proper but instead a less aggressive gas (slower etching), such as EDI (ethylene-di-iodide). This gas is selected as it is less aggressive against the substrate crystalline material than the gas used later for the actual trench etching and thus exposes the substrate surface without any overetch. This less aggressive gas etching step provides a smooth (defect free) surface in which to commence the actual FIB etching of the trench. The effect of this local cleaning process is observed in real time by an associated infra-red optical microscope or similar optical observation system which in one embodiment is coaxial with the ion beam.

It is to be understood that this process is not limited to the typical silicon integrated circuit substrates but also applies to other crystalline substrates used in semiconductors; of course the particular injected gases and FIB ions disclosed here are merely exemplary.

The associated apparatus includes an FIB tool in combination with an optical microscope and suitable controls.

DETAILED DESCRIPTION

Figure 6A:
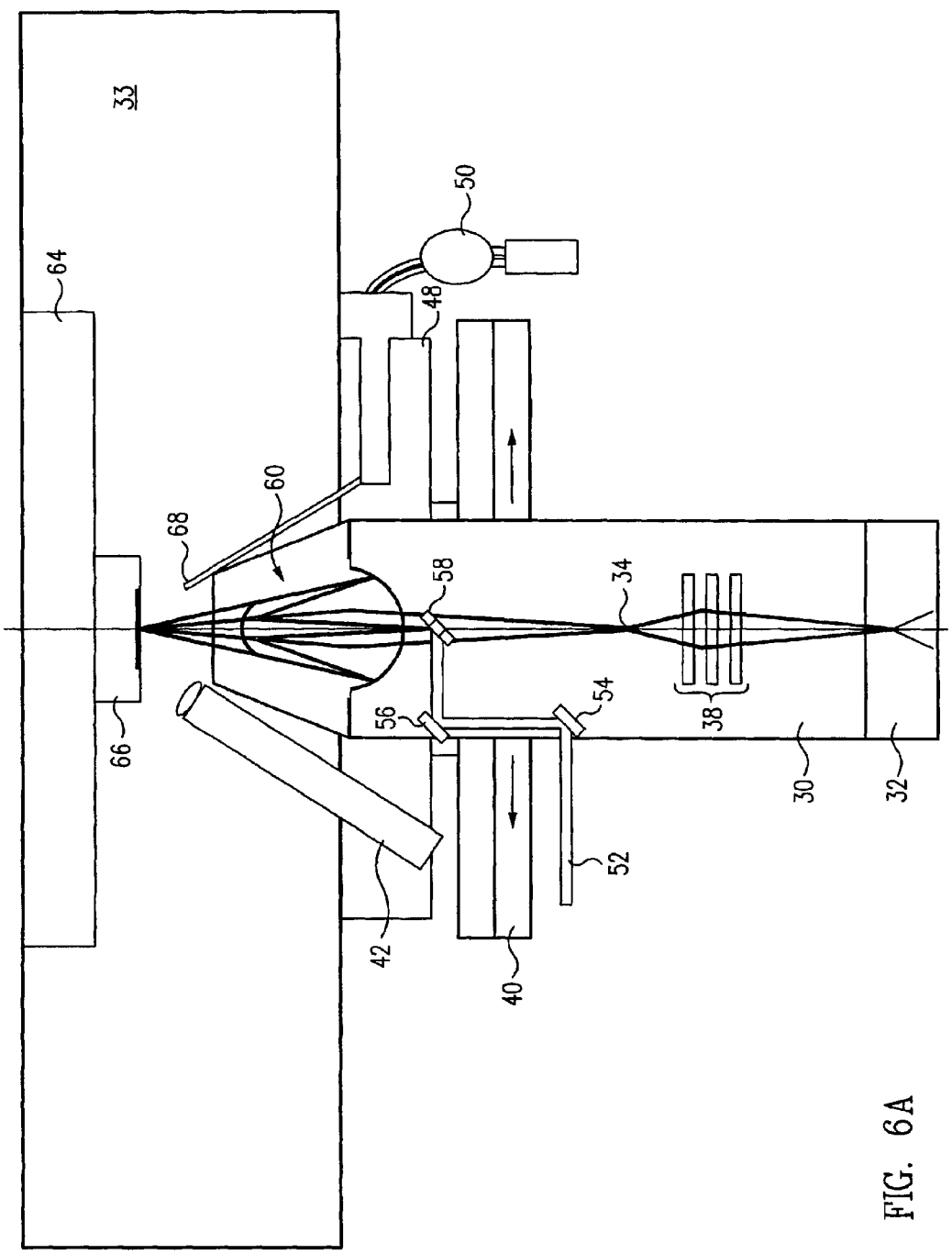
FIGS. 6a and 6b shows an apparatus suitable for use with the present process.
Figure 6B:
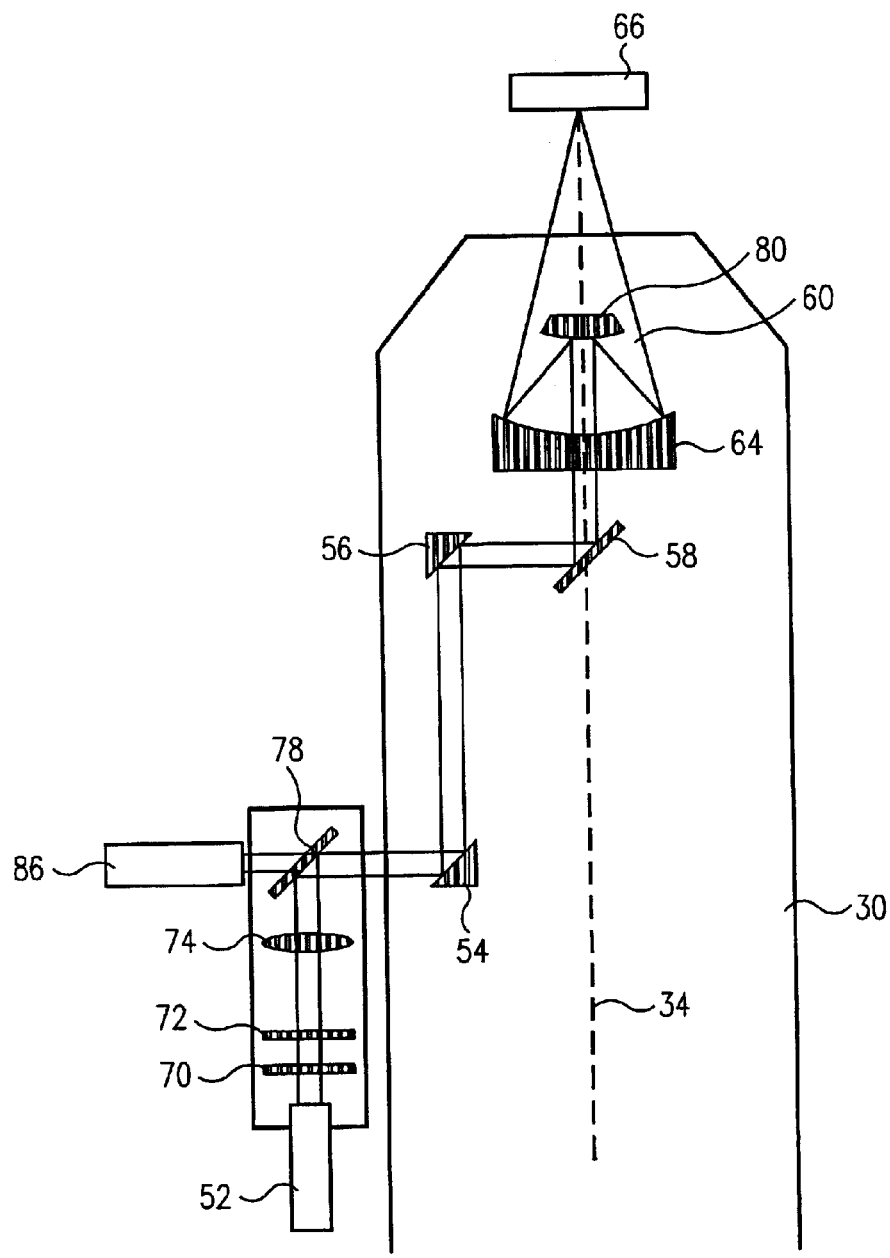

For detail of an FIB apparatus system useful in accordance with this disclosure, see, e.g., U.S. Pat. Nos. 6,225, 626 and 5,140,164. Conventional detail of this apparatus and the accompanying well known FIB techniques for forming trenches is not included herein except as shown in FIGS. 6a, 6b. Briefly, however, the FIB tool (apparatus) includes a source of (e.g., gallium) ions, an XY movable stage which moves the FIB column under the integrated circuit under test, a Z stage for adjusting the working distance of the workpiece to the FIB column so as to adjust the focus of the light optical column and for holding the workpiece which is typically an integrated circuit from which the packaging has been at least partly removed (or was never packaged), suitable vacuum enclosures and controls, the FIB column which accelerates and focuses the ions onto the workpiece, and conventional apparatus for injecting "chemistry" gas into the FIB under controlled circumstances to enhance the FIB etching. The light optical microscope, as part of the FIB column, is also present for observing the process. In addition, the FIB column has an associated FIB imaging subsystem which detects secondary electrons ejected by the workpiece and provides a visual display of the resulting image for use by the operator. Hence, not only does this system provide a light optical (e.g., infra-red) image, it also provides an electronic FIB image. Both of these images are displayed for the operator typically on a video monitor.

For additional detail of such a system, see also U.S. Pat. No. 5,140,164, also referred to above. Tools based on the well known FIB technology are in widespread use in the semiconductor industry and used, for instance, for integrated circuit repair, failure analysis and process monitoring. In terms of repair ("edits"), the repair is actually only to the metal interconnection layers overlying the actual integrated circuit semiconductor regions; hence, the repair is a circuit repair where "circuit" here refers to one or more of the various metal interconnection layers typically separated by layers of dielectric and overlying the actual crystalline substrate in an IC. The FIB mills a trench or hole or via, in this case through the IC substrate from the backside, so as to gain access to the metal layers.

It is also known to use the FIB tool from the IC topside surface to directly access the metal layers, but this disclosure is not concerned with such an approach. Certain ICs must be accessed from the backside surface such as flip-chips. Flip-chip is a type of packaging for integrated circuits in which the top layer of the IC is covered with an array of bond pads making direct access to the buried conductors (metallization or circuitry as referred to here) difficult or impossible even with the unpackaged ICs. For flip-chip packaged devices which are to be accessed by FIB techniques, the electrical interconnections in the package itself cover the entire principal surface of the IC so there is no possibility of accessing the metallization from the top side. Hence, access through the backside surface of the IC substrate is required for flip chip ICs, and other backside packages such as BGA (ball grid array) and others.

Hence, a method in accordance with this disclosure involves modification to the technique for forming the trench extending from the obverse (backside) surface of the IC substrate most of the way through the substrate but leaving a thin layer of silicon remaining at the bottom of the trench between the bottom (floor) of the trench and the principal surface of the substrate itself. This allows relatively easy access thereinafter (e.g., by the FIB) through the floor of the trench to the overlying metal layers.

Other aspects of the process are disclosed in co-pending U.S. patent application No. 10/161,272, entitled Method and Apparatus for Determining Thickness of a Semiconductor Substrate at the Floor of a Trench, inventors Erwan Le Roy and Chun-Cheng Tsao, attorney reference M-12496US, incorporated herein by reference in its entirety. This disclosure pertains to other improvements to FIB trenching for circuit modification. It is to be understood that the present method may be accomplished using the above described FIB tool in combination with an optical microscope as known in the field or modifications or improvements thereto.

The process disclosed here is exemplary. It involves etching a trench in a silicon semiconductor crystalline substrate which is part of a fabricated integrated circuit, using a focused ion beam with gallium ions. The integrated circuit has been prepared so that the packaging is removed at least on the backside surface (or perhaps the IC is not packaged) and the IC is conventionally mounted on a stage movable in the Z (vertical) direction. Typically, a distance of 100–1400 $\mu$m is maintained between the tip of the "chemistry" gas injector and the working surface of the trench. This FIB injector jet placement is determined through a calibration related to the ion beam focus and the actual touching of the jet onto a calibration fixture. This distance from the FIB injector jet to the working surface of the trench, is maintained constant by movement of the Z-stage in the vertical (Z) direction. Also, the optical focus of the microscope, typically using infrared light, is maintained on the trench floor by adjusting the Z-stage and thus conventionally focusing the optical microscope.

Note the use of infra-red wavelengths is known for optical observation through crystalline silicon (see U.S. Pat. No. 6,225,626 and also 5,821,549, incorporated herein by reference in its entirety). Typically, the optical microscope has an associated infra-red light source and includes a filter admitting the infra-red wavelengths at e.g. 950 nanometers with a 70 nm bandwidth. A typical current of the FIB is 12–15 nanoAmp. An exemplary thickness of the silicon substrate prior to etching the trench is 100–10 $\mu$m. Of course, these parameters and dimensions are exemplary.

Figure 1:
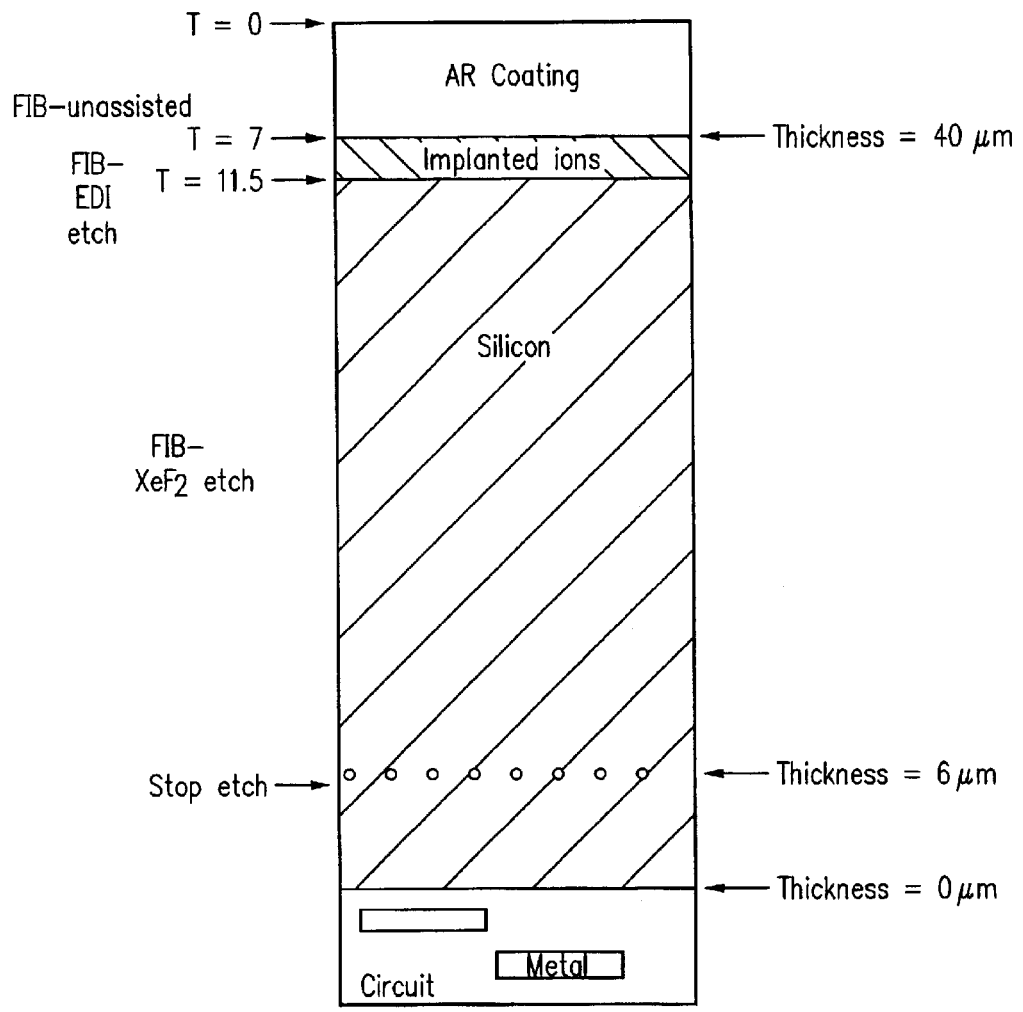
FIG. 1 shows graphically trench etching in accordance with this disclosure.

FIG. 1 therefore provides a graphical depiction of a trench etching process in cross-section accordance with this disclosure. The vertical axis represents both the cross-section of an IC and also the passage of time during the etching process which corresponds to various time points illustrated in accompanying FIGS. 2–5.

The upper portion of FIG. 1 represents the backside surface of the IC (workpiece) and the bottom portion labeled "circuit" represents collectively the various metal interconnections layers and the accompanying interlying dielectric layers formed on the principal surface of the actual IC substrate (die) which is labeled "thickness=0 mm". Prior to the depicted process of FIG. 1, the IC is either totally removed from its package or the backside surface of the package is removed. ("Package" here refers to the ceramic or plastic structure with accompanying external leads conventionally used to house an IC.) The entire backside surface of the thereby exposed IC die is then subject to lapping or polishing or milling using a conventional type machining tool of the type used in the semiconductor field, to render the entire backside surface as planar as possible. This planarity is with regards to how parallel the IC die front and back side surfaces are.

Then an anti-reflection (AR) coating is conventionally formed on the exposed backside substrate surface. This coating is typically silicon oxide or hafnium oxide. This AR coating is formed over the entire exposed backside surface and is provided in order to permit subsequent optical observations of the trenching process using the optical microscope.

Then with the AR coating present, the operator determines exactly where the trench is to be formed. The trench is typically rectangular in shape in plan view. Its size (length and width) and location are determined with reference to the known IC circuit layout and in accordance with the actual intended work to be carried out on the IC, such as metal layer editing. The cross-sectional area of the focused ion beam is a very small circular area, much smaller than the size (length/width) of the trench. A typical working cross section of the ion beam is 0.5 to 1 $\mu$m diameter and it is raster scanned at about 1.5 m/sec. Hence, the FIB is raster scanned over the surface area of the trench in order to perform the actual etching. This is conventional. In FIG. 1, the first step then is local removal of the AR coating which takes about three minutes for the trench surface area of 100×100 $\mu$m and is performed at the area where the trench is to be formed. This removal of the AR coating uses the process of an unassisted etch (with just the ion beam and no injected gas). This unassisted milling is intended to be a slow etching process, otherwise it will overetch.

This etching exposes the actual (silicon) substrate surface. At this point, an additional unassisted (no injected gas) FIB etch is used to smooth the exposed substrate surface. A typical duration of this FIB etch is six minutes for the trench surface area of 100×100 $\mu$m. It is intended to remove any surface defects initially present on the exposed substrate surface and ensure complete removal of the AR coating. Thus if there are local pits or scratches on the exposed surface, the entire area of the intended trench surface is reduced to the level of the bottom of such scratches or pits. The intention is to have the working substrate surface as planar as possible. The typical FIB current here is 12–15 nano Amps, but it need not be limited to this range. During this process, all the surface defects are amplified optically with suitable depth of focus of, for instance, 20 $\mu$m for easy observation. Some of the defects can only be observed optically; they will not show up on the FIB imaging at such high ion beam currents.

This unassisted FIB etching leaves a residual implanted ion layer at the exposed silicon surface due to the adherence and implantation of the incident ions (e.g., of gallium) from the FIB (typically operating at 30 keV).

It is then necessary to remove this implanted ion layer. This is done, again using the FIB, with an injected gas which is, e.g., ethylene-di-iodide (EDI) A typical flow rate of the EDI is sufficient to sustain a chamber pressure of $2.0 \times 10^{-5}$ Torr pressure near the turbo pump of the FIB chemistry gas injector.

As mentioned above, EDI is chosen to be less aggressive in attacking the material (silicon) of the substrate than is the second chemistry gas later used to actually etch the trench. Hence, these particular combinations of gases are exemplary. Other chemistries that would provide similar capability include other iodies including iodine and various chlorides and bromides, including chlorine and bromine. Also, there is no a priori requirement that this first chemistry gas necessarily be less aggressive than the second chemistry gas used in forming the trench, but it has been found to be beneficial to do so because the second gas is more aggressive in attacking silicon. That is, the etch rate of xenon difluoride is much greater than that of EDI in attacking silicon. The FIB etching with EDI is still fast enough to remove the gallium layer and fast enough to remove silicon and thereby maintain less surface gallium which would be built up due to implantation. The silicon is then exposed. The purpose of this step is to remove the implanted gallium build-up layer while maintaining the smooth substrate working face without removing the underlying silicon as is done in a later step.

At each step, the substrate working face is observed both optically using the IR optical microscope and, if desired, using FIB imaging. Ion beam imaging should normally be avoided to minimize incidental gallium implantation into areas of interest. Further detail of what is observed by the operator is described below.

Due to the depth of focus of the optical microscope, any surface defect present in the working substrate face of sufficient dimension is easily observed by the operator. If there are any observed residual surface defect, this are normalized by subsequent FIB etching. This normalization FIB-process takes advantage of the etching characteristics achieved using an etchant does not enhance etching at sharper angles such as defined by the defects and may even be reduced by some process such as creating more mobile surface constituents or enabling the filling in of negative topography and leveling of the positive topography as has been discussed in the literature for other applications. This provides the desired smoothing, i.e., normalization. The optical microscope image is used to check the substrate surface for smoothness before the actual trenching begins. The planarity is checked by interferometric observation.

Next, the actual (conventional) trenching is carried out using the FIB assisted with, e.g., xenon difluoride, again using a beam current of 12–15 nanoAmp. This proceeds as long as needed in order to achieve the desired depth of the trench which typically extends to within 2–6 $\mu$m of the principal surface of the substrate, that is just above the "circuit" in FIG. 1 as shown by the "stop etch" broken line.

Figure 2:
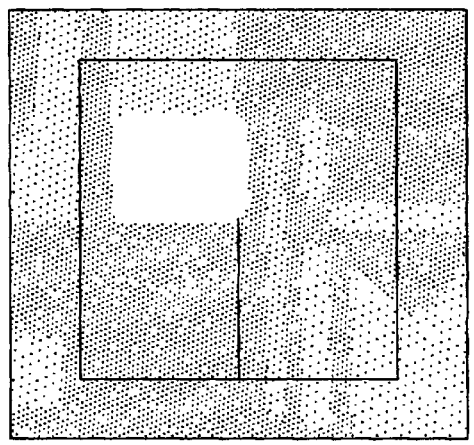
FIG. 2 shows an optical image of the trench area at the beginning of the present process.

FIGS. 2–5 show what the operator observes either as the optical image (from the IR microscope) or from the FIB image display at various times as depicted in FIG. 1. Hence, FIG. 2 shows the optical image (from the optical microscope) at what is designated as T=0 minutes in FIG. 1, which is just before the beginning of removal of the AR coating. The area outlined in white in FIG. 2 is the intended surface area of the trench, here defined as 100×100 $\mu$m.

Figure 3A:
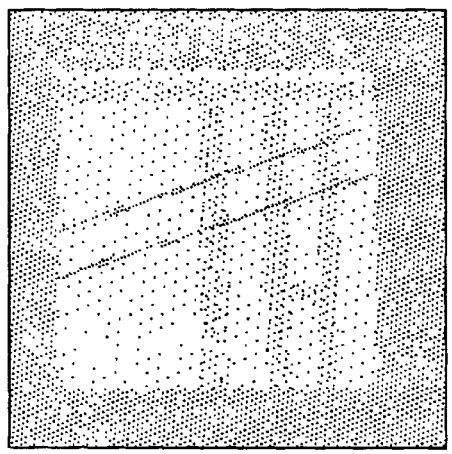
FIGS. 3a and 3b show respectively an FIB image and an optical image of the trench etching at a subsequent time period.
Figure 3B:
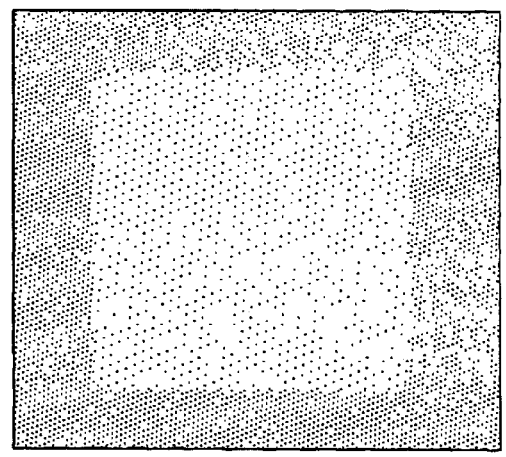

Then in FIG. 3a, the anti-reflection (AR) coating has been removed at the trench location at Time=7 minutes. (These times refer to the typical elapsed time for operating on the exemplary 100×100 $\mu$m area set forth above.) FIG. 3a is the FIB image using the secondary electron detector display. At this point, the AR coating has been removed defining the trench area as described above. Polishing marks and impurity areas in the exposed silicon surface (defects) have appeared as darker areas. The corresponding optical image at the same time is shown in FIG. 3b. In this case, the exposure time of the camera (video camera) coupled to the optical microscope is set to 350 milliseconds as a point of reference. The circuitry (metal regions on the principal surface of the substrate) is not visible in this image. Note that the optical image shown here can be used to "end point", that is, determine the completion of local removal of the AR coating which is easily observed due to the sharp drop in contrast at the AR coating—silicon interface.

Figure 4A:
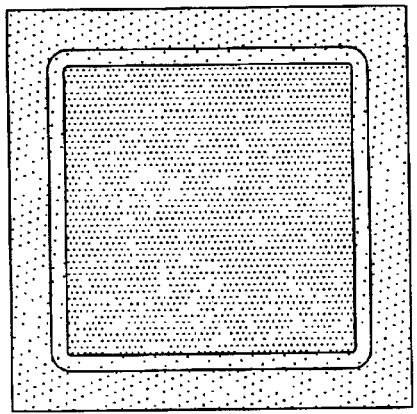
FIGS. 4a and 4b show respectively an FIB image and an optical image at a yet subsequent time.
Figure 4B:
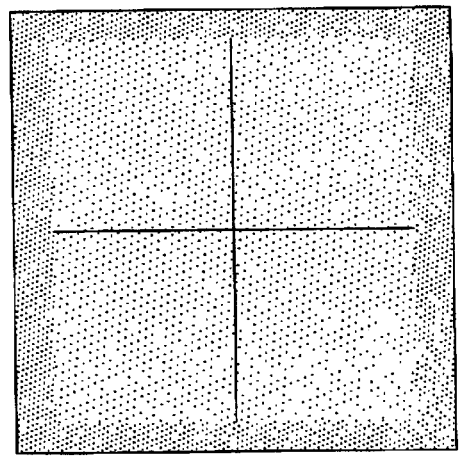

FIGS. 4a and 4b are taken at Time=10 minutes. At this time, three minutes of unassisted FIB etching (of the trench area) have been completed, and the polishing marks and impurities are no longer visible in the FIB image of FIG. 4a. The corresponding optical image (at the same time) is shown in FIG. 4b. In FIG. 4b, the implanted gallium ions from the unassisted FIB prevent passage of light forming a light reflecting "white/bright layer" observable in the infra-red. Therefore, the underlying circuitry on the front side of the substrate is not visible in FIG. 4b.

Figure 5:
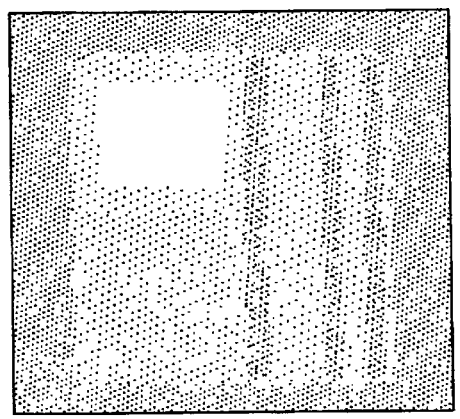
FIG. 5 shows an optical image of the trench at a yet subsequent time.

The final image FIG. 5 is taken at Time=11 minutes, 30 seconds, at which time the gallium implanted layer has been removed under the influence of approximately 1 minute and 30 seconds of FIB etching using the injected EDI gas. In the optical image of FIG. 5, the EDI gas in conjunction with the FIB has removed the gallium implanted layer but done so at a much slower rate than would the xenon-difluoride gas used later in conjunction with the FIB. This prevents non-uniformity and over-etching at the underlying non-implanted substrate surface due to the relatively slow substrate material removal rate. As a result of removal of the gallium build-up layer in this optical image, the infra-red light now penetrates down to the circuitry and is reflected back and hence a portion of the circuitry (in the lower left hand portion of FIG. 5) is visible as a darker rectangle. In this case, there is approximately 38 $\mu$m of silicon between the working face of the trench and the circuitry. The subsequent step which involves the actual FIB trenching using xenon-difluoride shown in FIG. 1 is not illustrated here by images as being a conventional process.

FIG. 6a shows in cross-section an apparatus used to carry out the above method. It is to be understood that the above method generally uses the understanding gained by the operator from observation of both the FIB image and the optical image to determine when each step in the etching process should be terminated. The FIG. 6a apparatus (which is, e.g., the commercially available IDS OptiFIB™ from Schlumberger) includes a conventional FIB column 30 having the ion source 32 and accelerating and focussing electrodes 38 and FIB imaging system (scintillator detector) 42. The ion beam 34 passes through the column 30. The column 30 is moved in the X and Y directions as indicated by the arrows by a precision XY stage 40. A sliding seal 48 is provided between the ion beam column 30 and the sample chamber 33. The sliding seal 48 provides the necessary environmental protection since the interiors of the chamber 33 and column 30 are typically at vacuum. Also provided is the FIB "chemistry" gas injection system which has conventional elements including reservoirs, piping and valves 50 and which terminates at the gas injector tip 68. The optical imaging system includes an optical fiber 52 which introduces the light which is then reflected (as free space light) after entering the column 30 by mirrors 54 and 56 and 58 down through the photon-ion objective lens 60. The ion beam and light beam are incident on the device under test (DUT) 66 which rides on a Z (vertical movement) stage 64. Stage 64 brings the device under test 66 (typically an integrated circuit) to the focus plane of the light optics. A typical distance between the tip of the photon-ionobjective lens 60 and the top surface of the device under test 66 is 14 mm. The gas injection system 50 and the scintillation detector 42 are in the same subsystem as is the column 30 so as to be fixed relative to the ion beam and light beam axes.

FIG. 6b shows details of the optical imaging system of FIG. 6a. Elements in FIG. 6b which are the same as in FIG. 6a have the same reference numbers. Additional detail shown in FIG. 6b includes the light diffuser 70, light filter 72, lens 74, and beam splitter 78. Also shown is the optical objective lens 64 and a second optical lens 80. The optical imaging for the user is captured by a charge coupled device (CCD) camera 86 which receives the light reflected back up from the device under test 66 via mirrors 58, 56, and 54 and back through beam splitter 78. The charge coupled device 86 is typically connected electrically to a computer to provide the optical image on a conventional computer monitor.

This disclosure is illustrative and not limiting; further modifications will be apparent to those skilled in the art in light of this disclosure and are intended to fall within the scope of the appended claims.

We claim:

1. A method of forming a cavity having a cavity depth in a crystalline substrate, comprising the steps of:
   a) applying a charged particle beam to a surface of the substrate without an injected gas into the beam, for a time sufficient to remove defects from the surface of the substrate;
   b) subsequent to step a), applying to the surface of the substrate a charged particle beam with a first gas injected therein, for a time sufficient to remove a surface layer of said substrate having ions implanted therein by the charged particle beam, said surface layer having a thickness; and
   c) subsequent to step b), applying to the surface of the substrate a charged particle beam with a second gas injected therein, for a time sufficient to define the cavity having said cavity depth;
   said cavity depth being much larger than said surface layer thickness.

2. The method of claim 1, wherein said crystalline substrate is a semiconductor substrate.

3. The method of claim 2, wherein said semiconductor substrate is silicon.

4. The method of claim 3, wherein the first gas is a halogen or halide.

5. The method of claim 3, wherein the first gas is ethylene-di-iodide.

6. The method of claim 3, wherein the second gas is a halide.

7. The method of claim 6, wherein the halide is XeF2.

8. The method of claim 7, wherein
   each charged particle beam is a focused gallium ion beam;
   said focused gallium ion beam operates at a beam current in the range between 12 and 15 nanoamps;
   said focused gallium beam operates at a beam energy of 30 keV;
   the first gas is ethylene-di-iodide having a flow rate sufficient to sustain a chamber pressure of approximately $2 \times 10^{-5}$ Torr.

9. The method of claim 3, wherein each charged particle beam is a focused gallium ion beam.

10. The method of claim 3, wherein the step a) is for a duration of 2 to 4 minutes.

11. The method of claim 3, wherein steps a), b), and c) include maintaining an approximately constant distance between a source of the beam and a working face of the substrate.

12. The method of claim 3, further comprising optically observing steps a), b), and c).

13. The method of claim 3, wherein the substrate initially has on its surface an antireflective coating that is at least partly removed before step (a).

14. The method of claim 13, wherein the at least partly removing of said anti-reflective coating is done by applying a charged particle beam to a surface of the substrate without an injected gas into the beam.

15. The method of claim 3, wherein the substrate includes a plurality of semiconductor regions extending into the substrate from a principal surface of the substrate, and steps a), b), and c) are carried out from an obverse surface of the substrate.

16. A method of preparing a surface of a crystalline substrate, comprising the steps of:
   a) applying a charged particle beam to the substrate without an injected gas into the beam, for a time sufficient to remove defects from the surface;
   b) subsequent to step a), applying to the surface of the substrate a charged particle beam with a first gas injected therein, for a time sufficient to remove a surface layer of said substrate having ions implanted therein by the charged particle beam, said surface layer having a thickness; and
   c) observing the surface with an optical instrument arranged coaxial with the charged particle beam.

17. The method of claim 16, wherein said crystalline substrate is a semiconductor substrate.

18. The method of claim 17, wherein said semiconductor substrate is silicon.

* * * * *